United States Patent [19]

Buhl

[11] Patent Number: 4,929,321
[45] Date of Patent: May 29, 1990

[54] METHOD AND APPARATUS FOR COATING WORKPIECES

[75] Inventor: Rainer Buhl, Sargans, Switzerland

[73] Assignee: Balzers Aktiengesellschaft, Balzers, Liechtenstein

[21] Appl. No.: 325,301

[22] Filed: Mar. 17, 1989

[30] Foreign Application Priority Data

Mar. 23, 1988 [CH] Switzerland .................. 1095/88

[51] Int. Cl.$^5$ ............................................. C23C 14/32
[52] U.S. Cl. ........................... 204/192.38; 204/298.41; 427/37
[58] Field of Search .................. 204/192.38, 298 D; 427/37; 250/426

[56] References Cited

U.S. PATENT DOCUMENTS

| 4,191,888 | 3/1980 | Meadows | 250/396 R |
| 4,452,686 | 6/1984 | Axenov et al. | 04/298 |
| 4,492,845 | 1/1985 | Kljuchko et al. | 219/121.36 |
| 4,511,593 | 4/1985 | Brandolf | 427/37 |

FOREIGN PATENT DOCUMENTS

| 0094473 | 11/1983 | European Pat. Off. | 250/426 |
| 0286191 | 10/1988 | European Pat. Off. | 250/423 |
| 3234100 | 3/1984 | Fed. Rep. of Germany | 204/298 |
| 8502067 | 2/1987 | Netherlands | 204/298 D |
| 430293 | 10/1983 | Sweden | 204/298 |
| 655632 | 4/1986 | Switzerland | 204/298 |
| 656400 | 6/1986 | Switzerland | 204/298 |
| 657242 | 8/1986 | Switzerland | 204/298 |
| 2117610 | 10/1983 | United Kingdom | 204/298 |

OTHER PUBLICATIONS

"Transport of plasma streams in a curvilinear plasma-optics system", I. I. Aksenov et al. *Soviet Journal Plasma Physics* 4(4), Jul.-Aug. 1978.
Patent Abstracts of Japan, vol. 10, No. 170(E-412)(2226), Jun. 17, 1986: & JP-A-61-22548 (Hitachi Seisakusho K.K.) Jan. 31, 1986.
*Nuclear Instruments and Methods*, vol. 185, Nos.1-3, Jun. 1981, pp. 25-27, North-Holland Publ. Co., Amsterdam/NL; J. H. Whealton: "Improvement of gas efficiency of negative ion sources".
Patent Abstracts of Japan, vol. 6, No. 72(E-105), May 7, 1982; & JP-A-57-11447 (Tokyo Shibaura Denki K.K.) Jan. 21, 1982.
Patent Abstracts of Japan, vol. 4, No. 170 (E-35)(652), 22 Nov. 1980; & JP-A-55-117856 (Hitachi Seisakusho K.K.) Sep. 10, 1980.
V. A. Saenko et al, "Source of plasma of metal vapours with a hollow cathode", *Fizika i Khimiya Obrabotki Materialo* vol. 20, No. 2 (1986), pp. 60-63.
V. A. Osipov et al., "Unit for depositing coatings by precipitation of ions extracted from a vacuum-arc plasma", *Pribory i Tekhnika Eksperimenta* vol. 6, pp. 173-175 (1978).
D. M. Sanders and E. A. Pyle, "Magnetic enhancement of cathodic arc deposition" *J. Vac. Sci Technol.* A 5(4), Jul-Aug. 1987, pp. 2728-2731.
I. I. Aksenov et al., "High-efficiency source of pure carbon plasma", *Sov. Phys. Tech. Phys.* 25(9) Sep. 1980, pp 1164-1166.
D. M. Sanders, "Ion beam self-sputtering using a chathodic arc ion source", *J. Vac. Sci. Technol.* A 6(3), May--Jun. 1988, pp. 1929-1930.
Ian G. Brown et al., "High current ion source", *Appl. Phys. Lett.* vol. 47, No. 4 Aug. 15, 1985, pp. 358-360.

*Primary Examiner*—Aaron Weisstuch
*Attorney, Agent, or Firm*—Notaro & Michalos

[57] ABSTRACT

A method and arrangement for the vacuum coating of workpieces by arc evaporation, comprises at least one evaporating cathode with a surface to be evaporated, an axis of the cathode intersecting the cathode surface. Workpieces to be coated are arranged around the axis at locations which are spaced radially outwardly and at an axial distance from the cathode surface. In order to prevent direct line of sight communication between the cathode surface and the workpieces, a visual shield is positioned between the cathode surface and the workpieces, which at least partly surrounds the axis. In this way, the ions which are evaporated from the cathode surface are deflected outwardly around the visual shield and toward the workpieces.

21 Claims, 1 Drawing Sheet

METHOD AND APPARATUS FOR COATING WORKPIECES

BACKGROUND OF THE INVENTION

The present invention relates to a method for coating workpieces by arc evaporation whereby the workpieces are remote from an area in direct view of the evaporation cathode. Further, the present invention relates to a vacuum coating apparatus for coating workpieces with at least one evaporation cathode arranged within a process chamber which may be evacuated and which contains at least one anode and further comprising a carrier arrangement for workpieces outside of direct view of the cathode.

The present invention is directed to the general technique of evaporating electrically conductive materials using cathode spots of an arc discharge.

This technique of evaporation is particularly suited for plasma aided coating, because the cathode spots do not substantially emit cathode material as a neutral vapor, as do other sources for vacuum coating, but rather predominantly emit ions The ions form, together with the electrons emitted as well, a plasma with a high density. Such a plasma allows coating with a high efficiency. Additionally, most favorable coating properties, such as high density and strength, low roughness, etc. are realizable by such plasma aided coating. This is valid for coatings which are formed by depositing metal vapor of the cathode material alone, as well as and especially for coatings formed from a compound of the metal with a reactive gas which is admitted into the remaining gas atmosphere within the process chamber. With the use of plasma aided vacuum coating techniques, the variety of compounds which may be reactively realized by addition of components from different sources during deposition on a substrate has been considerably extended beyond the well-known deposition of oxides.

In the present description, cathodes which are submitted to an electrical arc discharge, so that their material is heated by this arc to such an extent that it evaporates, are referred to as evaporation cathodes. Such a cathode is an electrically negatively supplied electrode emitting not only electrons for sustaining the arc, but also supplies the arc with ions, i.e., ionized atoms evaporated from the cathode. Of course, arc discharge with a completely cold cathode needs ignition in addition to connection to a d.c. supply, as is known in the prior art later cited. Because evaporation occurs at the cathode surface only at points, i.e. at the roots of the arc discharge which stochastically move along the cathode surface, and such points leave the impression of arcs to an observer, this evaporation method is often referred to as the arc evaporation technique.

For well-known arc evaporation techniques using flat evaporation cathodes, the directional distribution of the emitted ions follows substantially the cosine-law. This means that the stream of evaporated material which occurs in a direction tilted by an angle $\alpha$ and with respect to a perpendicular to the cathode surface, will be smaller by a factor of $\cos\alpha$ compared with the emission in said perpendicular direction. From the point of view of economic coating it is therefore advisable to arrange the substrates to be coated near a perpendicular axis on the middle of the evaporation cathode. When evaporating from cathode spots, this was additionally advisable up to now, because a substantial part of the material from the surface of the cathode is ejected in the form of liquid droplets, with a directional distribution which substantially differs from the directional distribution of the ions. Most, and especially the larger droplets, leave the cathode with a significant tangential component of trajectory. This is due to the mechanism of the arc discharge, the spots of which are freely movable on the cathode surface. Because the elementary mechanism is an evaporation at locally extremely overheated areas in the neighborhood of the arc spot, there is always a liquid phase of cathode material from which a part is ejected as droplets due to the vapor pressure of vapor generated at the area of molten material.

The droplets may solidify on their way to the workpieces or when they hit the substrates or workpieces an thus cause different disadvantageous qualities of the coatings, e.g. higher roughness of the coating surface, contamination of the coating, pronounced tendency of corrosion after grains resulting from droplets are broken off of the substrates etc. The least droplets are encountered on workpieces which are arranged in the neighborhood of the perpendicular axis, i.e., there where the coating efficiency is the largest.

Particularly, the present invention is directed to said phenomenon of droplets occurrence.

Known arrangements for vacuum coating using evaporation from cathode spots have attempted to exploit the different emission characteristics of vapor and droplets to generate coatings with the smallest possible number of droplet-caused deficiencies. For this purpose the substrates are arranged close to each other within a small area (relative to the diameter of the cathode) and around the axis of the cathode, with the largest possible distance from the cathode. The required large distance of the workpieces from the cathode on the one hand and the small number of workpieces which may be arranged near the axis, does not allow commercial production. Therefore, when using so-called arc evaporation, compromises were taken e.g. use of smaller distances or larger areas for the workpieces, which resulted in a substantial degradation of the coating quality due to the high proportion of droplets in the coatings. Therefore, different efforts have been directed towards reducing the number of droplets.

Some approaches to avoid the above problems separate the desired ions of cathode material from the undesired droplets by plasma optical techniques. Principally, these approaches always reside in leading the ions into an area which is not in direct view of the cathode. There the workpieces may be arranged and will not be hit by droplets, because the mass to charge ratio of such droplets is different from that of single ions by several decades.

One approach (known e.g. from DE-PS 32 34 100) provides for a rotational symmetrical carrier for workpieces along the axis of a container. Around said carrier there is arranged an evaporator of larger radius and of ring-like configuration. Its evaporating surface is not directed towards the substrates, but is directed outwards. The cylindrical wall of the container acts thereby as an ion-reflecting element.

Here the area which may be used for arranging workpieces to be coated simultaneously is restricted to the limited area adjacent the axis of the container.

Another approach, known from FIG. 2 of U.S. Pat. No. 4,452,686, exclusively utilizes the ions emitted along the axis of a rotational symmetrical container and leads these ions by reflection at the wall of the container around an obstacle which collects the droplets into a droplet-free area, wherein the workpieces are arranged.

The area which may be utilized for arranging workpieces to be simultaneously coated is restricted to that part of the cross-sectional area of the container which is also the umbra of the obstacle for keeping off the droplets. Although this area will increase with decreasing diameter of the cathode, only a few workpieces may be coated simultaneously. Thus, at least in an area adjacent such obstacles the overall cross-sectional area of the container may not be exploited equally well for arranging workpieces to be coated.

From the article "Transport of plasma streams in a curvilinear plasma-optics system" by I. I. Aksenov et al, *Soviet Journal Plasma Physics*, 4(4), July-August 1978, it is know to lead the evaporated ions along a deflecting tube towards a workpiece, so that, again, a direct path between workpiece an cathode is avoided. The workpiece is arranged at an open end of the deflecting tube and line of sight contact is prevented by a bend in the tube. The area which is exploitable here for workpieces to be simultaneously coated, is also relatively small.

OBJECT OF THE INVENTION

The present invention has an object to provide for an improved method and apparatus of the above-mentioned kind, so that the area which may be exploited for workpieces to be simultaneously coated is considerably enlarged, which leads to improved productivity of such a method, and of such an arrangement.

SUMMARY OF THE INVENTION

Principally, interruption of the direct view between workpiece and cathode is inventively exploited to enlarge the area for workpieces to be coated and is achieved by using the fact that the ions evaporated from the cathode, departing from an axial narrow area surrounded by a ring-shaped shield, are radially led outwards, so that the workpieces may be arranged at the outer periphery, thus within a substantially annular area, which is, because of the outwardly increasing radius, significantly larger than the area which is necessary for generating and deflecting the ions.

When referring to such an arrangement as a container around an axis perpendicular to a cathode surface, the diameter which is usable to arrange workpieces as substrates is not limited by deflecting means, as reflectors, but is given by the outer diameter of the ring-shaped area which is provided for arranging workpieces to be simultaneously coated.

To realize the deflection of the evaporated ions radially outwards in a simple manner, an annular anode is associated with the cathode through the opening through which the ions are led and are thereby radially deflected outwards.

To further cause the fewest possible ions to propagate in the axial direction and not be deflected outwards and thus to deflect then radially outwards or at least to improve such deflection, there is arranged above the cathode an auxiliary electrode screen or shield, i.e. a tube-like member which is biased positively with respect to the cathode, i.e. given an anodic potential, and at which the ions are deflected by single or multiple reflection.

The end of the tube-like member remote from the cathode is directly and preferably used as a visual range limit between the cathode and the workpieces. This auxiliary electrode screen acts as a tube above the cathode, so that workpieces disposed radially outwards and at such a radial distance that the upper corner of said tube acts as a viewing range limit, i.e. the bottom of the tube cannot be seen and thus the cathode cannot be seen.

There is provided at said auxiliary electrode member at the end thereof, remote from the cathode, a collar projecting radially outwards, so that, because of the anodic potential applied to said collar and due to radial components of a magnetic field provided, there is achieved radially outwards deflection of the ions.

With said end of the auxiliary electrode member and with said ring anode, there is realized a staggered deflecting structure which opens in the axial direction, and the ions propagating out of the auxiliary electrode screen are deflected more and more along a relatively long distance.

Principally, this effect is also realized when at least two ring electrodes are provided which may be applied with different anodic potentials, by providing a structure which is similar to that realized by the above-mentioned ring anode and the said ring collar at the auxiliary electrode screen.

The complete arrangement referred to up to now and with the basic construction and the features additionally mentioned, is preferably realized in twin structure, so that two cathodes which are coaxially arranged supply coating material into the same area for workpieces.

Instead of the ring shaped anode mentioned above or of the ring-shaped electrodes of anodic potential, there may be and preferably will be provided an anodic potential at the inside wall of the container radially behind the area for the workpieces.

Even if the arrangement is constructed in sin(le (not twin) configuration, there is nevertheless preferably provided a magnetic field which, on one hand, is directed substantially from the cathode towards the area for the workpieces, but which, on the other hand, comprises a second part which is symmetrical to the just mentioned magnetic field with respect to a place perpendicular to the axis of the arrangement and disposed across the area for the workpieces. Such symmetric pattern of magnetic field is therefore preferably realized independent of the cathode arrangement being a single or a twin arrangement.

It may be advisable in certain cases to generate said magnetic field controllably so as to modulate the magnetic field with respect to time, for instance to accurately influence coating of the workpieces, e.g. to homogenize said coating, and/or to accurately influence evaporation of the cathode. When a symmetric field pattern is used the said modulation of the two symmetric parts of the magnetic field is principally controllable independent from each other, so that when there is desired to provide a preselected variation, e.g. a preselected phasing of the modulations of the said two parts of the magnetic field, such a desired variation is easily provided. As an example, the magnetic field may be amplitude modulated.

In spite of the fact that it is possible to generate the said magnetic field with the help of permanent magnets which are, if said magnetic field is to be modulated, e.g. mechanically moved, in a preferred embodiment at least parts of said magnetic field are electromagnetically generated by a coaxial coil arrangement.

It should be noted that the axis need not necessarily be perpendicular to the cathode surface, but must intersect that surface.

BRIEF DESCRIPTION OF THE DRAWING

An example of the invention will now be described with reference to the sole figure, which is a cross-sectional schematic diagram of the apparatus of the invention.

DESCRIPTION OF THE PREFERRED EMBODIMENT

Figure 1:
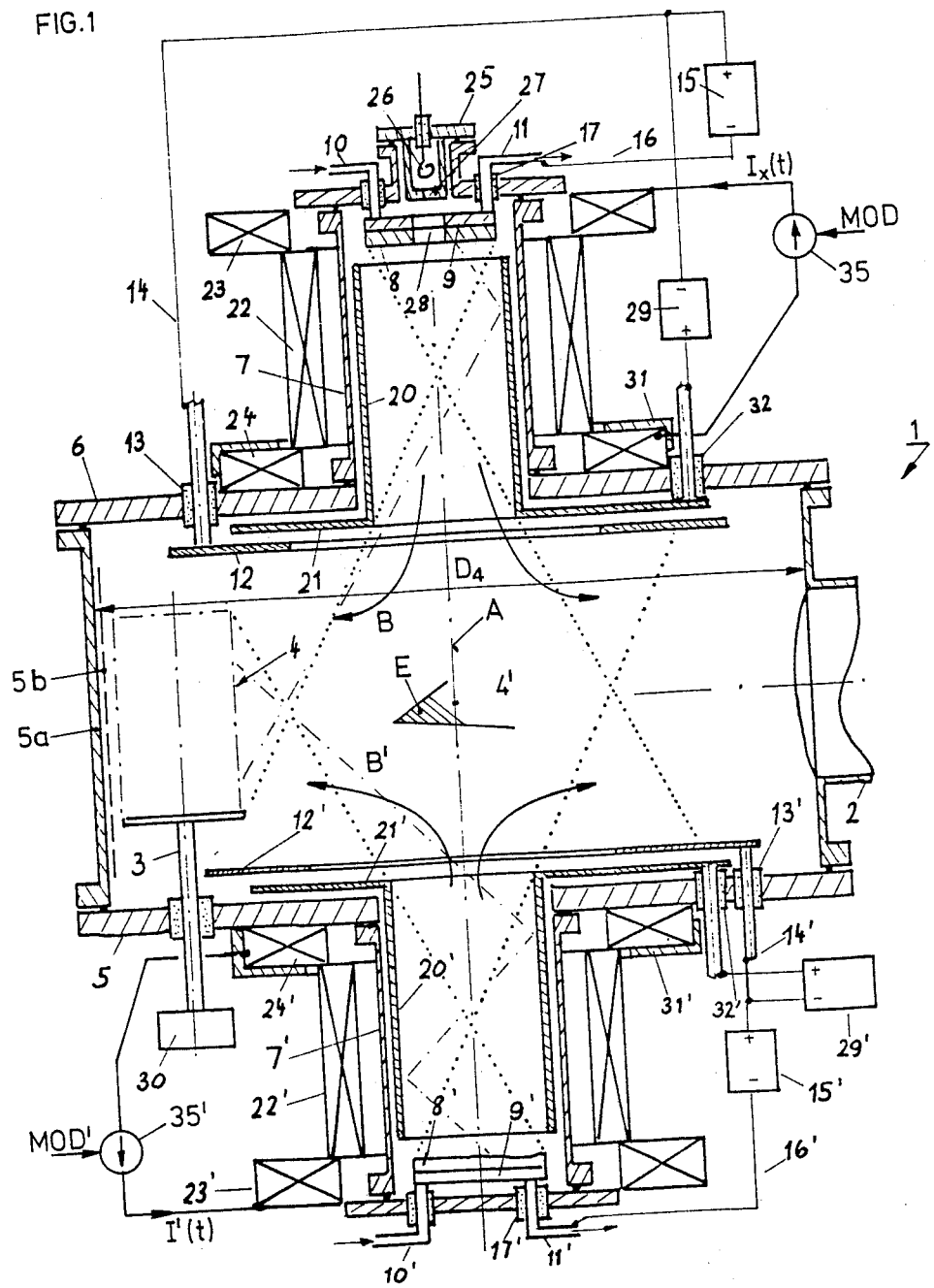

The figure shows a coating chamber 1 which may be evacuated through a tube 2 and in which several rotatable carriers 4 are arranged within an annular area 4' to carry workpieces as substrates to be coated. The rotatable carriers 4 are driven for rotation by axles 3 which are led through the wall of the chamber 1 and are vacuum-sealed. For simplicity only one such carrier is shown, but there may be arranged on a circle around axis A of the chamber 1, a multitude of such carriers of equal or similar kind. Because of the large diameter $D_4$ of the usable area, there may be arranged a multitude of workpieces 4 to be simultaneously treated.

As may be seen, the chamber 1 is provided with cylinders 7 and 7', affixed respectively to a coverplate 6 and to a bottom plate 5. In these cylinders, the cathodes 8 and 8' for arc evaporation are respectively arranged. The cathodes are supported by cooled supports 9, 9' respectively, whereby inlets and outlets 10 and 11, 10' and 11' for a cooling medium are led through the wall of the chamber in electrical insolation therefrom. To each of the two cathodes a ring-shaped anode 12, 12' is respectively associated, which anodes are fed by insulated electrical leads 13, 13' and 14, 14' respectively from positive poles of voltage sources 15, 15'. The negative poles of these voltage sources are connected by leads 16, 16' respectively, and by the cooling medium tubes 11, 11' to the cathode supports 9, 9'.

The discharge channels are each surrounded by an auxiliary electrode screen. According to the described embodiment, these screens are formed by metallic cylinders 20, 20' and by ring collars 21, 21' linked to said cylinders 20, 20'. These cylinders 20, 20' are connected through isolators 32, 32' to the positive poles of voltage sources 29, 29' and as these sources are connected serially to the voltage sources 15, 15', the rings 21, 21' and the cylinders 20, 20' are energized, with respect to the cathode, to a potential which is the sum of the voltages of the said two serially connected voltage sources. Preferably these voltage sources are adjustable, so that the potentials required for an accurate deflection of the ions may be adjustably selected according to the desired operation of the apparatus.

It is not absolutely necessary to provide the ring collars 21, 21' around the cylindric parts 20, 20'. Often it will suffice to provide either said rings or said cylindrical parts.

The ring electrodes of anodic potential, possibly of different staggered anodic potentials, significantly influence the deflection trajectory of the ions radially outwards. The number of such ring electrodes, the largeness of their central openings and their electric potential may be selected according to a desired deflection, according to which the locations of the carriers for the workpieces will be selected.

Preferably and additionally to, or instead of the ring anodes 12 and 12', there is provided along the wall 5a an anodically driven screen as shown in dash-line at 5b. It is evident that such an anodically driven screen 5b will be electrically insulated from the wall 5a of the chamber, and that the tube 2 will be led through said anode 5b in electrical isolation therefrom.

If the cylindrical parts of the auxiliary electrodes 20, 20' are omitted, as was mentioned above as one possibility, the walls of the cylindrical tubes 7, 7' of the vacuum chamber may serve themselves as a visual or line of sight limitation, so as to avoid line of sight contact between the cathode and the workpieces 4. Most important for the deflecting effect of the auxiliary electrodes on the ions are the areas along the edges of the cylinders 20, 20' pointing towards the workpieces or the inner edges of the ring collars 21, 21'.

The cylinders 7, 7' are surrounded, as shown, by three magnetic coils 22, 23, 24 and 22', 23' and 24' each, which generate within said cylinders 7 and 7' a magnetic field substantially parallel to the axis A, whereby the said coils are driven with currents of such polarities that the magnetic fields B, B' are generated with directions of vectors as shown in the figure. This magnetic field acts in a well-known manner on the charged particles. This means that the electrons within the cylinders 7, 7' or within the cylinders 20, 20', when provided as auxiliary electrodes, propagate with helical trajectories as they propagate around and along the magnetic field lines and they drift along these field lines until reaching the main area 4' of the chamber where they are attracted by the anodes or parts which are at an anodic potential.

Because of the control of the electron trajectories by the magnetic field, only relatively few electrons reach the walls of the auxiliary cylinders 20, 20'. The positively charged ions are repelled by the anodic potential of the auxiliary electrodes 20, 20' or their rings 21, 21' as well as from the anode 12, 12', and propagate on trajectories bent therearound, so that they are deflected towards and on to the workpieces on substrate carriers 4. Two such trajectories for ions are represented diagrammatically in the figure by dash-dotted lines as qualitative examples.

The coils 22 and 22' generate the major part of the homogeneous magnetic field for the control of the plasma, whereas the shorter coils 23, 23' provide for the final adjustment by which the magnetic field may be adjusted for differently sized cathode areas and crosssections of the tube-like auxiliary electrodes acting as reflectors. By these coils, the magnetic field may thus be optimized with respect to its distribution in space. When tailoring the magnetic field, one must consider that the least possible field lines should lead from the cathode areas to be evaporated on to the auxiliary electrodes and that the magnetic field lines which cross the periphery of the cathode area should not run with too big a distance from the interior walls of the auxiliary electrodes to ensure that the emitted ions are optimally utilized. The coils 24, 24' amplify the magnetic field for the entrance of the ions into the main area of the coating chamber and these coils provide that the least possible amount of electrons reach the auxiliary electrode 20, 20' near its openings into the coating area 4'. Electrons which reach the auxiliary electrode are lost and reduce the plasma density within the coating chamber and thus the ion stream which is usable for the coating, so that the electric power would have to be enlarged to ensure a predetermined coating rate. By the auxiliary field generated by the coils 24, 24', the magnetic column protruding from the cathode will completely reach the coating area without touching the auxiliary electrodes. To even improve this effect, these coils 24, 24' may be surrounded by a surrounding element 31 made of magnetically soft iron.

By correct adjustment of these axially parallel magnetic fields B, B' and of the working voltages of the voltage sources, the electrodes made of cylinders 20, 20', and possibly the rings 21, 21', may be replaced by a single ring electrode wire arranged according to the figure, where the rings 21, 21' join the respective cylinders 20, 20'.

During a coating operation the arc discharge which leads to evaporation of the cathode occurs between the respective evaporation of the cathode and the associated anode. The dimensions of the ring electrodes, i.e. the cylindrical parts 20, and 20' and the diameter of the circle along with the carriers 4 for carrying the workpieces are arranged, should be such that the workpieces or substrates do not see the cathodes from any of their points. The opening angles which are representative for the area into which droplets which are ejected from the cathode may penetrate, are marked in the drawing by dotted lines. The substrates or, more generally, workpieces on the carriers must thus be arranged outside of that area so that the workpieces will not be hit by droplets of target material from the cathode.

With respect to known arrangements, there is achieved with the inventive coating arrangement a significantly improved efficiency with respect to the utilization of ions for the coating. For instance, it was possible with the described arrangement, at an arc current of 400 A per cathode, an arc voltage of 28 V and with a potential at the auxiliary electrodes acting as ion reflectors of +36 V, further with a potential of the substrates or workpieces of −30 V (both measured with respect to the evaporation cathodes), and with magnetic field of 98 Oe along the axis of both cylinders 20, 20', to measure a total ion current towards the substrates on one of the workpiece carriers 4 of 1.9 A. Thereby completely dropless coatings were produced, i.e. the separation of ions from droplets simultaneously ejected from the cathode was absolutely satisfactory.

The inventive cathode evaporation method may not only be used for evaporating metals, but may also be used for evaporating non-metallic materials if such materials have a sufficient electrical conductance.

The example which was described shows two cathode evaporators within a vacuum chamber, but it is obviously possible to provide such an arrangement with only one or with more than two such evaporation cathodes or to operate the arrangement described with the lower cathode used for evaporation of a first material and, shifted in time, to operate the upper evaporation cathode for evaporating a second material.

In a further embodiment of the invention, the same arrangement which is used for coating may also be used as an arrangement for etching substrates or workpieces by cathode etching before their coating. Therefore, it is advisable to provide besides the cathodes for evaporation a further cathode provided as a thermionic cathode 26 for a low voltage discharge. Thereby the hot cathode may advantageously be arranged in an additional chamber 25 which is linked to the coating chamber by an opening 27 within a separating wall and an opening 28 in cathode 8 and in support 9. The separating wall may act as an evaporation cathode with a cathode area pointing towards the coating chamber for the evaporating process With such an additional heated cathode and an anode 12, 12' in the coating chamber a low voltage arc—struck by a short connection of the chamber 25 with the anode 12—is operated in a reduced pressure gas atmosphere containing an inert gas such as Argon, preferably supplied via chamber 25 (not shown in the figure), whereby the inert gas ions which hit the substrates or workpieces provide for etching of their surfaces and thus provide in a well-known manner for a continuous cleaning of that surfaces. Thereby there is often reached a significantly improved adhesion of a coating subsequently applied by ion deposition. Additionally there may be noticed that even during ion deposition, there always occurs simultaneous etching. The deposition and thus the coating thickness builds up at higher rate than etching occurs. Thus the coating growth exceeds the etching effect.

The ratio of coating deposition to coating etching may be influenced, beyond others, by the partial pressure of the inert gas within the remaining gas atmosphere or may also be influenced by biasing the substrates.

As may be seen from the figure by the fact that the ions are radially deflected outwards and to all sides, the area which may be exploited to arrange workpieces, i.e. the are 4', is significantly enlarged compared with such areas of well-known arrangements, so that the inventive arrangement operated according to the inventive method results in improved commercial efficiency.

In the figure there is shown a preferred embodiment in which the arrangement comprises substantially identical sub-arrangements, geometrically arranged in symmetry with respect to a plane E across the main area 4' for workpieces 4. The inventive arrangement may also be constructed from one single such sub-arrangement, for instance, from the upper part of the figure. Even in this case there is preferably generated the complete magnetic field B, B' as shown in the figure, i.e. even in this case there will be arranged axially opposite the single cathode with respect to plane E a magnetic arrangement which generates the symmetric part B' of the magnetic field.

Thus, if the inventive apparatus is built up only from the upper part of FIG. 1 with which the magnetic field B is generated, there will be preferably arranged a magnetic arrangement as realized by one or more of the coils 22', 23', 24' and with this magnetic arrangement there will be realized the part B' of the magnetic field.

The magnetic fields B, B' may be realized as shown by electromagnetic arrangements, but it is possible to realize at least a part of the fields by permanent magnets.

To locally control the deposition on the workpieces 4, and with respect to time, the magnetic fields B, B' may be modulated in time, e.g. amplitude-modulated. To do so at least one of the coils 22, 22' to 24, 24' may be driven with currents which may be modulated in time, e.g. to generate amplitude-modulated fields B, B'. Thereby and if the arrangement has its twin form as shown in the figure, each of the symmetric coil arrangements may be modulated independent from each other, so that the dependency of modulation of those fields may be selected as necessary by, for instance, selecting the phasing between the two modulations. By modulating the magnetic fields, the rate of deposition on the workpieces 4 is controlled and/or the time and local evaporation rate at one or at both of the cathodes 8, 8' is controlled.

In the figure, the possibility of modulating the magnetic field is schematically shown by current sources 35, 35' which drive the coil arrangements, whereby these current sources may be modulated at respective control inputs for modulation, denoted by MOD, MOD'.

We claim:

1. A method for coating workpieces by arc evaporation, comprising the steps of:
   evaporating ions from a cathode surface having an axis intersecting said surface;
   arranging workpieces to be coated around said axis at locations radially outward and axially distant from said cathode surface;
   providing visual shield means between said cathode surface and said workpieces at least partially surrounding said axis to prevent said workpieces from line of sight communication with said cathode surface; and
   deflecting said ions radially outwardly around said visual shield means towards said workpieces.

2. Vacuum coating arrangement for coating workpieces, comprising an evaporation chamber containing therein:
   at least one evaporation cathode with a surface to be evaporated;
   at least one anode;
   with respect to an axis intersecting said cathode surface, axially and radially distant from said surface, an annular area surrounding said axis for accommodating workpieces;
   between said cathode surface and said annular area a visual shield substantially surrounding said axis and preventing workpieces within said area from line of sight contact with said surface; and
   deflection means to deflect ions evaporated from said surface, radially outwardly around said visual shield into said annular area.

3. The arrangement of claim 2, comprising a second evaporation cathode, a second visual shield and second deflection means, said second cathode, shield and deflection means being substantially symmetrically arranged with respect to said first cathode, visual shield and deflection means and with respect to a plane through said annular area and perpendicular to said axis. area.

4. The arrangement of claim 2 said at least one cathode being associated with an annular anode axially distant therefrom, said deflecting means leading said ions through the opening of said annular anode.

5. The arrangement of claim 2 comprising a tube-like member arranged substantially coaxial to said cathode surface, said member being electrically energizable at an anodic potential with respect to said cathode.

6. The arrangement of claim 5, the end of said tube-like member remote from said surface acting as a said visual shield between said annular area and said cathode surface.

7. The arrangement of claim 5, said tube-like member being provided at its end remote from said cathode surface, with a radially projecting outward collar.

8. The arrangement of claim 5, comprising adjacent the end of said tube-like member remote from said cathode, the inner diameter of said annular anode being larger than the diameter of said tube-like member.

9. The arrangement of claim 2, comprising at least two annular anodes axially distant from said cathode, said anodes being energizable at an anodic potential with respect to said cathode.

10. The arrangement of claim 9, said anodes being energizable at different anodic potentials.

11. The arrangement of claim 2, comprising a magnetic arrangement generating a magnetic field substantially directed from said cathode surface into said annular area and around said visual shield.

12. The arrangement of claim 2, comprising at least one thermionic cathode adjacent said evaporation cathode for providing a low voltage arc discharge.

13. The arrangement of claim 12, said thermionic cathode being arranged within a cathode chamber, said cathode chamber being separated from said evaporation chamber by a separating wall, said thermionic cathode being linked with said evaporation chamber through an opening within said separating wall.

14. The arrangement of claim 13, wherein said wall comprises one of said at least one evaporation cathode.

15. The arrangement of claim 2 being rotational symmetrical with respect to said axis.

16. The arrangement of claim 2, further comprising an anode disposed radially outward from said annular area.

17. The arrangement according to claim 2, comprising a magnetic arrangement generating a first magnetic field directed from said cathode into said annular area and a second magnetic field symmetrical with respect to said first magnetic field and with respect to a perpendicular plane on said axis and through said annular area.

18. The arrangement according to claim 2, said deflection means comprising a magnetic arrangement generating a magnetic field, at least a part thereof leading from said cathode surface into said annular area, said magnetic arrangement being modulatable to generate a magnetic field which is controllably variable in time.

19. The arrangement of claim 18, two parts of said magnetic field being generated by independently modulatable magnetic arrangements.

20. The arrangement of claim 2, said deflection means comprising at least one magnetic coil.

21. The arrangement of claim 20, said at least one magnetic coil being arranged coaxially to said axis.

* * * * *